United States Patent [19]

Peacock

[11] Patent Number: 4,837,723
[45] Date of Patent: Jun. 6, 1989

[54] METHOD AND APPARATUS FOR CONTINUOUS TIME-VARIANT DIGITAL FILTERING

[75] Inventor: Kenneth L. Peacock, Tulsa, Okla.

[73] Assignee: Amoco Corporation, Chicago, Ill.

[21] Appl. No.: 8,995

[22] Filed: Jan. 30, 1987

[51] Int. Cl.$^4$ .................... G06F 15/31; G06F 15/58; G01V 1/38
[52] U.S. Cl. ............... 364/724.01; 364/421; 367/41; 367/46
[58] Field of Search ............ 364/421, 724, 724.01, 364/724.05, 724.11, 724.12; 367/43–46, 40, 41

[56] References Cited

U.S. PATENT DOCUMENTS

| | | | |
|---|---|---|---|
| 3,512,127 | 5/1970 | Burg | 367/73 |
| 3,689,874 | 9/1972 | Foster et al. | 367/46 |
| 4,234,938 | 11/1980 | Allen et al. | 367/46 |
| 4,312,050 | 1/1982 | Lucas | 367/44 |
| 4,397,006 | 8/1983 | Galbraith, Jr. | 364/421 |
| 4,535,417 | 8/1985 | Peacock | 364/724 |
| 4,630,242 | 12/1986 | Done | 364/421 |
| 4,672,545 | 6/1987 | Lin et al. | 364/421 |
| 4,686,657 | 8/1987 | Dellinger et al. | 364/421 |
| 4,713,775 | 12/1987 | Scott et al. | 364/191 |

OTHER PUBLICATIONS

Dimri, "On the Time-Varying Wiener Filter," *Geophysical Prospecting*; 34, pp. 904–912 (1986).
Ristow et al; "Time-Varying Prediction Filtering by Means of Updating," *Geophysical Prospecting*, 27, pp. 40–61 (1979).
Pann et al., "A Class of Convolutional Time-Varying Filters," *Geophysics*, vol. 41 No. 1 (Feb. 1976) pp. 28–43.

*Primary Examiner*—Gary V. Harkcom
*Assistant Examiner*—Dale M. Shaw
*Attorney, Agent, or Firm*—Timothy D. Stanley

[57] ABSTRACT

A continuous time-variant digital filtering method and apparatus. In particular, a method for continuous time-variant digital filtering of a digitized signal comprises the steps of windowing the input digitized signal into discrete windows. For each discrete window of the input digitized signal, an autocorrelation matrix is determined. Thereafter, a filter coefficient matrix for each window of the input digitized signal is determined from the autocorrelation matrix. Corresponding filter coefficients from each filter coefficient matrix and window of the input digitized signals are sequentially collected and interpolated for each sample point of the input digital signal to form continuous filter operators. Each continuous filter operator is sequentially convolved with the input digitized signal to form a partial output signal and the partial output signals from the convolution of each continuous filter operator with the input digital signal are summed to form a final output signal.

17 Claims, 9 Drawing Sheets

FIG.1

PRIOR ART

FIG.4A INVARIANT DESIGNED ON COMPLETE TRACE

FIG.4B INVARIANT DESIGNED ON MIDDLE EVENT

FIG.4C VARIANT

FIG.7A INPUT DATA

FIG.7B AUTOCORRELATION

FIG.8A OUTPUT DATA

FIG.8B AUTOCORRELATION

FIG.9A OUTPUT DATA

FIG.9B AUTOCORRELATION 4,837,723

METHOD AND APPARATUS FOR CONTINUOUS TIME-VARIANT DIGITAL FILTERING

BACKGROUND OF THE INVENTION

The present invention relates generally to a method and apparatus for continuous time-variant digital filtering. More particularly, a novel method and apparatus are provided for continuous time-variant digital filtering of seismic data to obtain seismic sections in which complex reverberations can be suppressed.

Geophysical exploration for hydrocarbons and other minerals using the seismic technique comprises imparting seismic energy into the earth and recording the resulting seismic waves, which propagate through the earth after reflections and/or refractions, as electrical signals. The electrical signals are then digitized for subsequent computer implemented processing in order to produce seismograms, i.e., maps of the subsurface geologic structure.

As is well known, any electrical signal is comprised of a number of fundamental component signals of differing amplitude and frequency. Digital filtering is a process for separating the various component signals within an electrical signal. In particular, the electrical signals recorded by geophones in seismic exploration can be considered to represent a time series comprising a reflectivity function and a source wavelet. By filtering the recorded signal, geophysicists can obtain a measure of the earth's reflectivity function which can provide information regarding the subsurface geological structure.

The Wiener filter is one of the most effective tools for the digital reduction of seismic data. It constitutes the keystone of many current deconvolution methods. In one application, this filter can be used to deconvolve a reverberating pulse train into an approximation of a zero delay unit impulse. More generally, it is possible to derive Wiener filters which remove repetitive events having specified periodicities. In such context, the Wiener filter can be viewed as a predictor of coherent energy. Consequently, the phrase "predictive deconvolution" is understood by those in the art as a method of decomposing an electrical signal in which coherent energy is reinforced.

The technique set forth by Burg in U.S. Pat. No. 3,512,127 describes a deconvolution filter to reduce reverberation effects caused by multiple reflections of the imparted seismic energy from near surface reflectors. Additionally, Peacock in U.S. Pat. No. 4,535,417 recognizes that the amplitude and frequency content of the imparted seismic wavelet can decay as a function of time and consequently proposes a time-variant filter using a Hilbert transform and a time-varying instantaneous frequency control function to process electrical signals having a time-varying electrical character. Similarly, others such as Ristow and Kosbahn, "Time-Varying Prediction Filtering by Means of Updating," *Geophysical Prospecting*, 27, p. 40–61 (1979), and Pann and Shin, "A Class of Convolutional Time-Varying Filters," *Geophysics*, v. 41, No. 1, February, 1976, p. 28–43, other approaches to developing time-variant filters. However, Applicant is presently aware of no technique for generating a continuous time-variant filter operator which does not require excessive computer memory nor one which does not comprise splicing together discrete time windows of invariantly filtered time windows. Applicant's technique is not constrained to filter type or signal nature. Moreover, applicant's method and apparatus provide for both time-variant prediction distance as well as time-variant filter length.

SUMMARY OF THE INVENTION

In accordance with the present invention, a continuous time-variant digital filtering method and apparatus are provided. In particular, a method for continuous time-variant digital filtering of a digitized signal comprises the steps of windowing the input digitized signal into discrete windows. For each discrete window of the input digitized signal, an autocorrelation matrix is determined. Thereafter, a filter coefficient matrix for each window of the input digitized signal is determined from the autocorrelation matrix. Corresponding filter coefficients from each filter coefficient matrix of the input digitized signals are sequentially collected and interpolated for each sample point of the input digital signal to form continuous filter operators. Each continuous filter operator is sequentially convolved with the input digitized signal to form a partial output signal and the partial output signals from the convolution of each continuous filter operator with the input digital signal are summed to form a final output signal.

DESCRIPTION OF THE PREFERRED EMBODIMENT

The present invention relates generally to a novel method and apparatus for time-variant digital filtering of discretely sampled signals. In particular, a method and apparatus are provided for time-variant digital filtering of digitized seismic-trace signals.

In order to more fully understand the present invention, the following general discussion regarding digital filtering with an exemplary application to seismic data is provided. In geophysical seismic exploration, a seismic source imparts seismic energy into the earth's subsurface formations and seismometers record the earth's response thereto as seismic-trace signals (a type of electrical signal). As is well known, any electrical signal is comprised of a number of fundamental signals. In particular, the semismic-trace signals x(t) can be characterized as being a convolution of an earth reflectivity function r(t) with a seismic source wavelet w(t) as set forth in the expression:

$$x(t) = w(t) * r(t) \tag{1}$$

where * denotes convolution.

Through such characterization, it is possible to filter the seismic-trace signal to obtain a measure of the earth's reflectivity function from which geophysicists can deduce the geological character of the subsurface formations.

By discretely sampling the seismic-trace signal x(t) to form a sampled signal $x_t$ one can employ digital filtering techniques and the capabilities of digital processing units. In fact Wiener filters, a specific type of digital filter, are one of the more effective tools for digital processing of seismic-trace signals. The digital filtering process can generally be described by the following expression:

$$y_\tau = \Delta t \sum_t x_t a_{\tau-t} \tag{2}$$

where
$x_t$ is the input signal;
$a_t$ is a filter;
$y_\tau$ is the output signal;
$\Delta t$ is the sampling increment; and
t and $\tau$ are discrete time variables.

Figure 1:
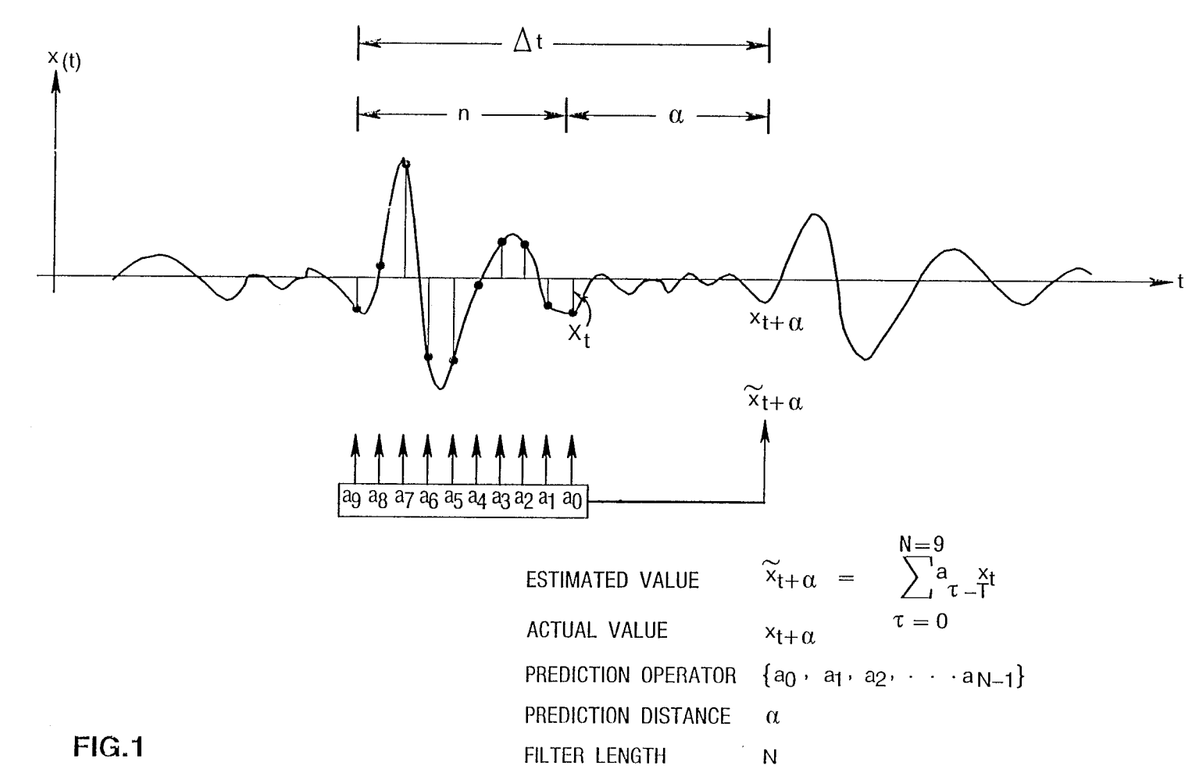
FIG. 1 is a representation of the application of Wiener filter to a signal $x_t$.

Assuming the sampling increment $\Delta t$ to be unity and defining the filter $a_t$ to be a prediction operator with a prediction distance $\Delta$, the output signal $y_t$ can then be expressed as an estimate of the input signal $x_t$ at some future time. Thus, one can write the expression:

$$y_\tau = \sum_t x_t a_{\tau-t} = \overline{x}_{t+\alpha} \tag{3}$$

where $\overline{x}_{t+\alpha}$ is an estimate of $x_{t+\alpha}$ as shown in FIG. 1.

A prediction error operator $f_t$ can be obtained from the difference between the actual value of the output signal $x_{t+\alpha}$ and the estimated value of the output signal $\overline{x}_{t+\alpha}$. The prediction operator $a_t$ can be defined by an n-length series:

$$a_t = a_0, a_1, \ldots, a_{n-1}.$$

The prediction error operator $f_t$ (with a prediction distance $\alpha$) can then be defined as:

$$f_t = 1, \underbrace{0, 0, \ldots, 0}_{\alpha - 1 \text{ zeroes}}, -a_0, -a_1, \ldots, -a_{n-1}.$$

By minimizing the difference between the predicted signal and the actual output signal e.g., $$\sum_t (x_{t+\alpha} - \overline{x}_{t+\alpha})$$

a least squares or Weiner filter can be obtained.

The n-length Weiner filter results from a solution of the following matrix:

$$\begin{bmatrix} r_0 & r_1 & \cdots & r_{n-1} \\ r_1 & r_0 & \cdots & r_{n-2} \\ \vdots & & & \vdots \\ r_{n-1} & r_{n-2} & \cdots & r_0 \end{bmatrix} \begin{bmatrix} a_0 \\ a_1 \\ \vdots \\ a_{n-1} \end{bmatrix} = \begin{bmatrix} g_0 \\ g_1 \\ \vdots \\ g_{n-1} \end{bmatrix} \tag{4}$$

where $r_t$ is the autocorrelation of the input signal $x_t$, $g_t$ is the cross correlation between the desired output signal $x_{t+\alpha}$ and the input signal $x_t$, and $a_t$ ;l is the filter.

With further simplification matrix (4) can be written in the following matrix form:

$$\begin{bmatrix} r_0 & r_1 & \cdots & r_{n-1} \\ r_1 & r_0 & \cdots & r_{n-2} \\ \vdots & & & \vdots \\ r_{n-1} & r_{n-2} & \cdots & r_0 \end{bmatrix} \begin{bmatrix} a_0 \\ a_1 \\ \vdots \\ a_{n-1} \end{bmatrix} = \begin{bmatrix} r_\alpha \\ r_{\alpha+1} \\ \vdots \\ r_{\alpha+n-1} \end{bmatrix} \tag{5}$$

where n is the filter length and the $\alpha$ is the prediction distance.

Alternatively, a prediction error filter operator $f_t$ having a prediction distance of unity ($\alpha=1$) can be obtained from matrix (5) and written in the following matrix form:

$$\begin{bmatrix} r_0 & r_1 & \cdots & r_n \\ r_1 & r_0 & \cdots & r_{n-1} \\ \vdots & & & \vdots \\ r_n & r_{n-1} & \cdots & r_0 \end{bmatrix} \begin{bmatrix} 1 \\ -a_0 \\ \vdots \\ -a_{n-1} \end{bmatrix} = \begin{bmatrix} \beta \\ 0 \\ \vdots \\ 0 \end{bmatrix} \tag{6}$$

where $\beta = \sum_{i=0}^{n} b_i r_i$ and $b_o = 1$ $b_i = -a_{i-1} \; i = 1, \ldots n.$ or in the more general matrix form for an n-length filter having an indefinite prediction distance $\alpha$ as follows:

$$\begin{bmatrix} r_0 & r_1 & \cdots & r_{\alpha+n-1} \\ r_1 & r_0 & \cdots & r_{\alpha+n-2} \\ & & \cdot & \\ & & \cdot & \\ r_{\alpha-1} & r_{\alpha-2} & \cdots & r_n \\ & & \cdot & \\ r_\alpha & r_{\alpha-1} & \cdots & r_{n-1} \\ & & \cdot & \\ & & \cdot & \\ & & \cdot & \\ r_{\alpha+n-1} & r_{\alpha+n-2} & \cdots & r_0 \end{bmatrix} \begin{bmatrix} 1 \\ 0 \\ \cdot \\ \cdot \\ 0 \\ -a_0 \\ \cdot \\ -a_{n-1} \\ \cdot \\ \cdot \\ 0 \end{bmatrix} = \begin{bmatrix} \delta_0 \\ \delta_1 \\ \cdot \\ \delta_{\alpha-1} \\ 0 \\ \cdot \\ \cdot \\ \cdot \\ 0 \end{bmatrix} \quad (7)$$

where $\delta_0 = r_0 - (r_\alpha a_0 + r_{\alpha+1} a_1 + \ldots + r_{\alpha+n-1} a_{n-1})$ $\delta_1 = r_1 - (r_{\alpha-1} a_0 + r_\alpha a_1 + \ldots + r_{\alpha+n-2} a_{n-1})$ $\delta_{\alpha-1} = r_{\alpha-1} - (r_1 a_0 + r_2 a_1 + \ldots + r_n a_{n-1})$ In terms of a Wiener filter, the left-hand matrix of Eq. 7 represents the input signal autocorrelation matrix and the right-hand column vector represents the position values of the cross-correlation between the desired output signal and the input signal.

The resolution of such a Wiener filter can be controlled by setting the prediction distance $\alpha$ and the filter length n such that the predictable (i.e., repetitive) energy, having periods between $\alpha$ and the $n+\alpha-1$ time unit, are removed. Moreover, the output signal wavelength cannot be greater in length than $\alpha$. Hence, for shorter prediction distances $\alpha$, one gets finer resolution.

Figure 2:
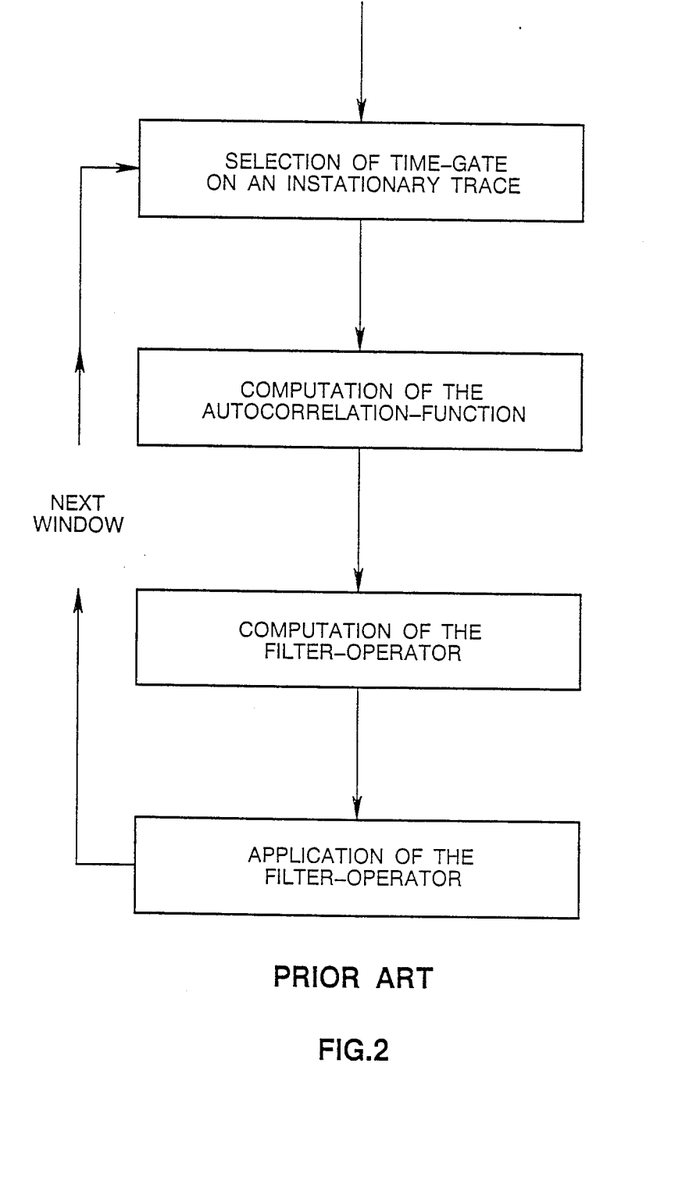
FIG. 2 is a representation of the process flow diagram of prior art time-variant digital filtering techniques.

With this form of digital filters as an example, applications of previous digital filters to time-variant signals will be discussed with reference to FIG. 2. Initial attempts to develop time-variant digital filters comprised nothing more than the computation of digital filter operators for a plurality of separate segments of the input signal and the application of each filter operator to its corresponding segment. The various filtered segments were then fitted together as shown by D. Ristow and B. Kosbahn in "Time-varying Prediction Filtering by means of Updating" *Geophysical Prospecting*, 27 p. 40–61 (1979). Digital filters of this nature become extremely cumbersome to handle because of the dense nature of the filter coefficients thus obtained. Alternatively, a time-invariant filter operator can be designed for a selected segment of a signal and then applied to the entire length of the signal. This alternative approach has the advantage of forming a less cumbersome digital filter, but the application of such a filter to the entire length of the signal (and not merely the segment from which it was designed) oftentimes can lead to erroneous results.

Figure 3:
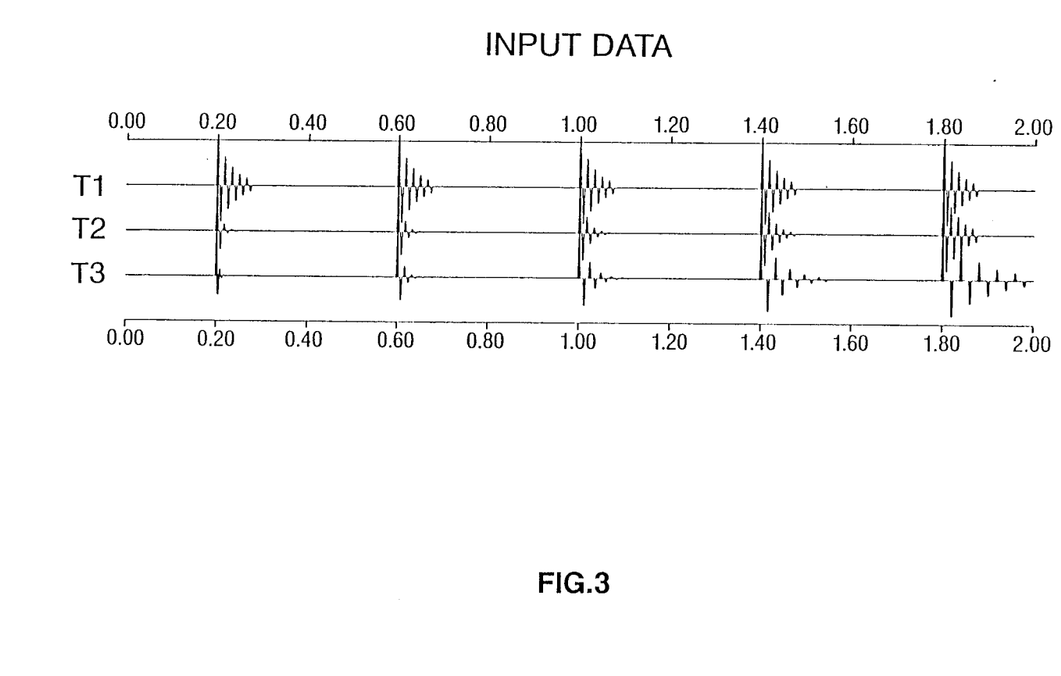
FIG. 3 is a representation of three separate seismic input signals.
Figure 4A:
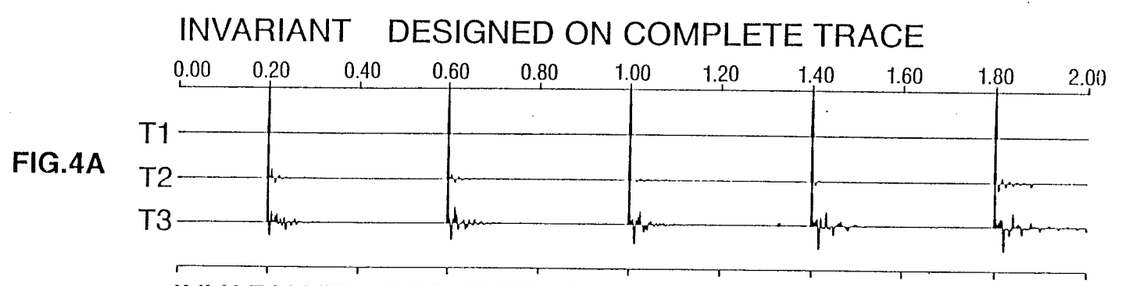
FIG. 4A illustrates the prior art invariant predictive deconvolution technique as applied to the seismic signals of FIG. 3.
Figure 4B:
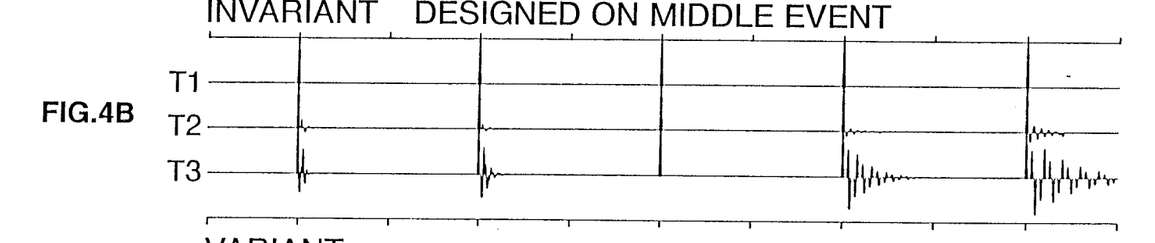
FIG. 4B illustrates the prior art invariant predictive filter technique as applied to the signals of FIG. 3.
Figure 4C:
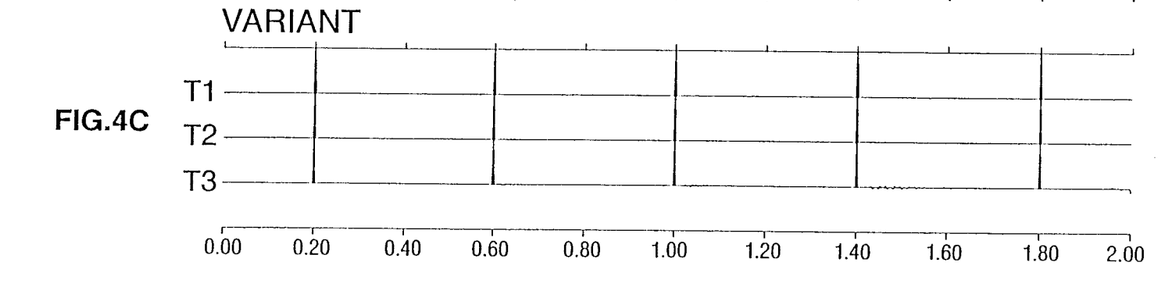
FIG. 4C illustrates a time-varying predictive deconvolution filter of the present invention as applied to the seismic signals of FIG. 3.

FIG. 3 depicts three different input signals (T1, T2, T3) having different reverberatory character. FIG. 4a represents the application of a prior art time-invariant digital filter designed over the complete length of the signals of FIG. 3. FIG. 4b represents the application of a prior art time-invariant digital filter designed about the middle events shown in the signals of FIG. 3 and applied oer the entire length of such signals. Conversely, the method and apparatus of the present invention provide a novel method of continuous time-variant digital filtering designed over the entire length of the signal without the penalty of excessive computer memory consumption and the advantage of reducing reverberatory effects over the entire length. FIG. 4c represents the application of a time-variant filter of the present invention to the signals in FIG. 3. The improvement in the suppression of the various forms of reverberatory signals over the prior art approaches is clear.

Figure 5:
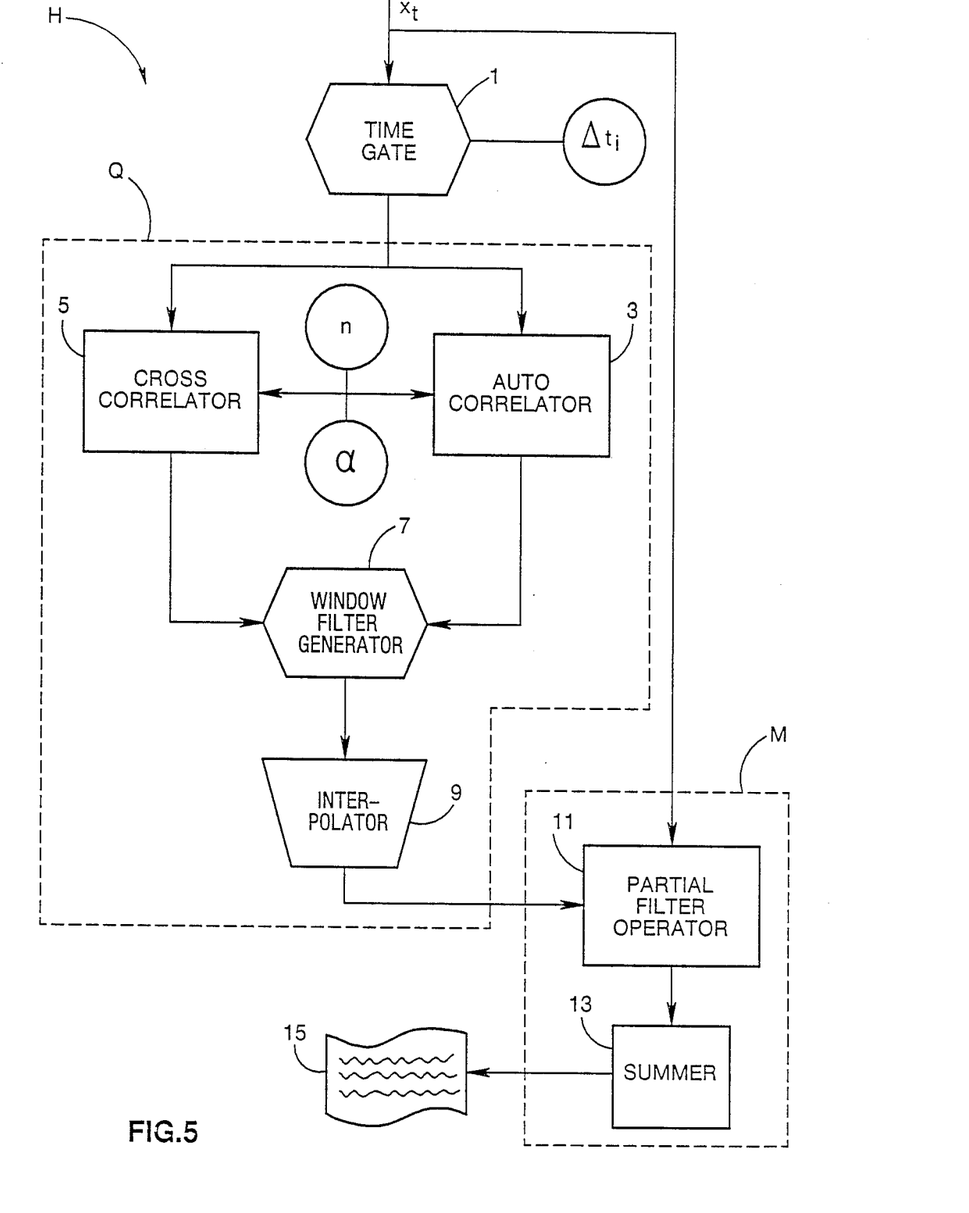
FIG. 5 is a schematic representation of the time-variant digital filter of the present invention.

With reference to FIG. 5, a time-variant filter H of the present invention is shown. The time-variant filter H can be seen to include a time gate 1 for windowing input digitized signals $x_t$ into discrete time windows $\Delta t_i$. Preferably, the time windows $\Delta t_i$ can be selected to range from five times the filter length to ten times the filter length and have a step size of 0.1 to 0.5 seconds. The time-variant filter H also includes a filter generator Q and a continuous filter operator M. More specifically, means are provided with the time gate 1 to control both time window length and window step size. The windowed input digitized signals are provided to the filter generator Q.

The filter generator Q comprises means for determining continuous filter functions to be implemented in the continuous filter operator M. In particular, the filter generator Q comprises an autocorrelator 3 and a cross-correlator 5 as well as means for controlling filter length n (i.e., the number of filter coefficients) and means for controlling filter prediction distance $\alpha$. Having selected filter length n and filter prediction distance $\alpha$, the autocorrelator 3 obtains autocorrelation signals $r_t$ for each time window $\Delta t_i$ over the entire length of the input digitized signals (i.e., i=1, 2, ... k where k can be any number). In a similar fashion, the cross-correlator 5 obtains cross-correlation signals $g_t$ for each time window $\Delta t_i$ over the entire length of the input signal by cross-correlating the input digitized signal $x_t$ with a desired output signal $x_{t+\alpha}$.

A window filter generator 7 using the autocorrelation signals $r_t$ and cross-correlation signals $g_t$ obtains a prediction error operator $f_t$ having a prediction distance $\alpha$ for each time window $\Delta t_i$. An interpolator 9 is then provided to collect corresponding elements of filter the prediction error operator $f_t$ and to interpolate corresponding elements thereof for each sample point of the input digitized signal. The interpolator 9 also curve fits each set of interpolated corresponding prediction error operators to form continuous filter functions Fm (where m is a dummy variable representing the number of sets).

Each set of continuous filter functions Fm is sequentially provided to the continuous filter operator M including a partial filter operator 11 which operates over entire length of the input digitized signal $x_t$ to form partially filtered signals $S_m$. The partially filtered signals $S_m$ are summed by a summer 13 to form finally filtered signals $\psi$. The finally filtered signals $\psi$ can then be displayed as conventional seismographic sections 15. Those skilled in the art will appreciate that the time-variant filter H described above can be constructed with digital computers.

Figure 6:
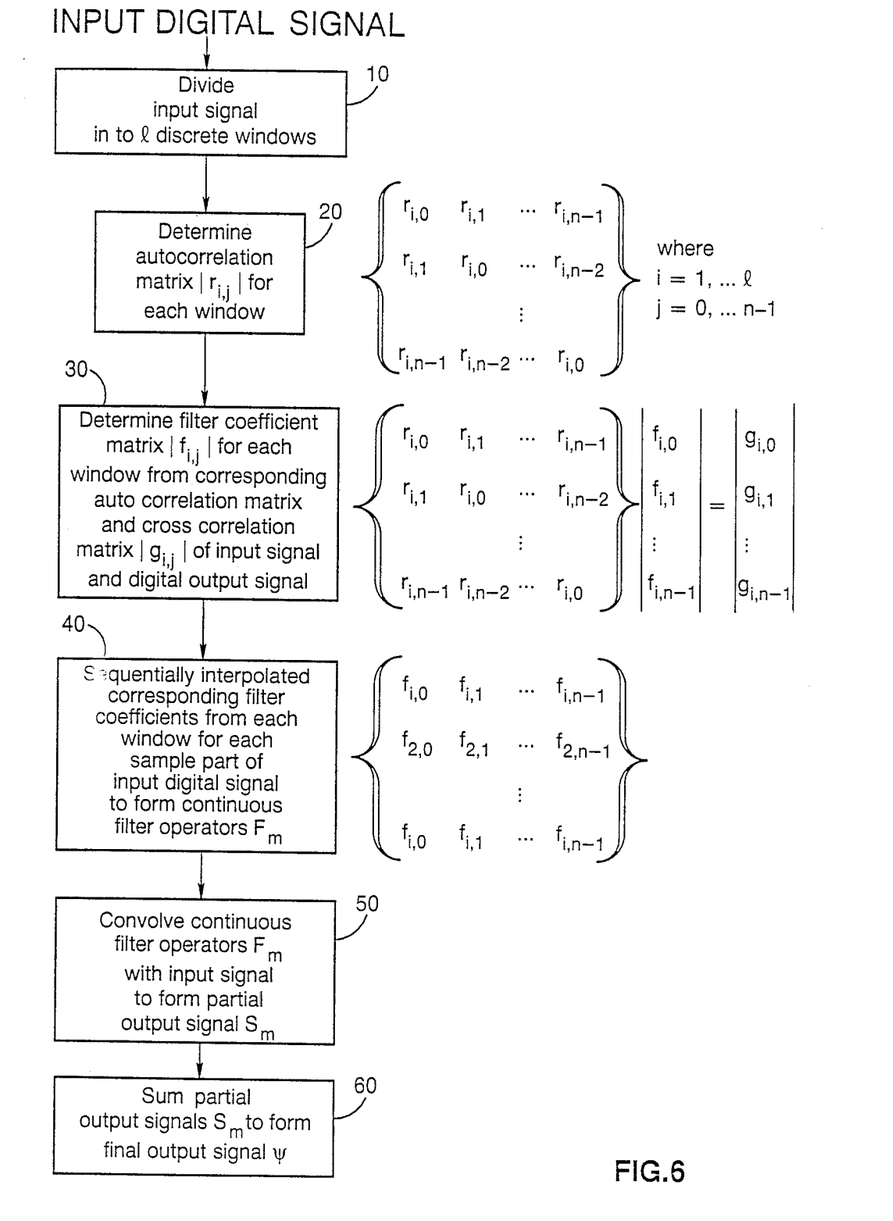
FIG. 6 illustrates a process flow diagram of the present invention.

Looking now to FIG. 6, a generalized flow diagram of the method of the present invention is depicted. A discretely sampled input signal $x_t$ is gated into time windows $\Delta t_i$ of predetermined lengths at 10. The time windows $\Delta t_i$ are preferably overlapping. An autocorrelation function $r_{i,j}$ for each window $\Delta t_i$ of the input signal $x_t$ is determined at 20. For the autocorrelation function $r_{i,j}$ the subscript i refers to the ith window and the subscript j refers to the lag of the autocorrelation coefficient (where j=1, 2, ... n=1). The letter n represents the length of the filter. A filter operator $f_{j,i}$ for each window $\Delta t_i$ is designed at 30. By way of example such filter operator can be designed for a specified filter length n and an prediction distance $\alpha$ as set forth in Eqs. 4 and 7. However, those skilled in the art will appreciate that other techniques can be employed to obtain filter operators $f_{j,i}$. The steps in blocks 10 to 30 are repeated until the last time window of the input signal has been reached. Corresponding filter operators ($f_{o,i} f_{1,i}, \ldots, f_{j,i}$) are gathered at 40. Since corresponding filter operators do not exist for every sample point within the discretely sampled input signal $x_t$ but rather only at selected sample points, the corresponding filter operators are interpolated for every sample point and then curve fitted, by one of any available techniques, to form continuous filter functions $F_1$, $F_2$, $F_m$ at 60 (where m is a dummy variable).

To conserve memory capacity, only one set of corresponding filter coefficients at a time are curve fitted to form continuous filter functions. Each continuous filter function $F_m$ is then sequentially applied to the entire input signal $x_t$ to form partially filtered signals $S_m$ at 50. After the last continuous filter function $F_m$ has been applied to the input signal $x_t$, the partially filtered signals $S_m$ are summed at 60 to obtain a final output signal $\psi$. Hence, those skilled in the art will appreciate that a novel technique for time-variant digital filtering has been generated which overcomes many of the processing limitations of known methods of time-variant digital filtering. In particular one should note the results of applying the filter technique of the present invention in FIG. 4C to the input signals of FIG. 3 and comparing these results with prior art technique results shown in FIGS. 4A and B.

In order to more readily appreciate the significant enhancement in seismic data with the present invention, the following comparisons were made. Looking first to FIG. 7A, a set of seismic data are presented prior to processing with either a time-variant or time-invariant filter FIG. 7B represents an autocorrelation of the input data of FIG. 7a prior to filtering.

Figure 7A:
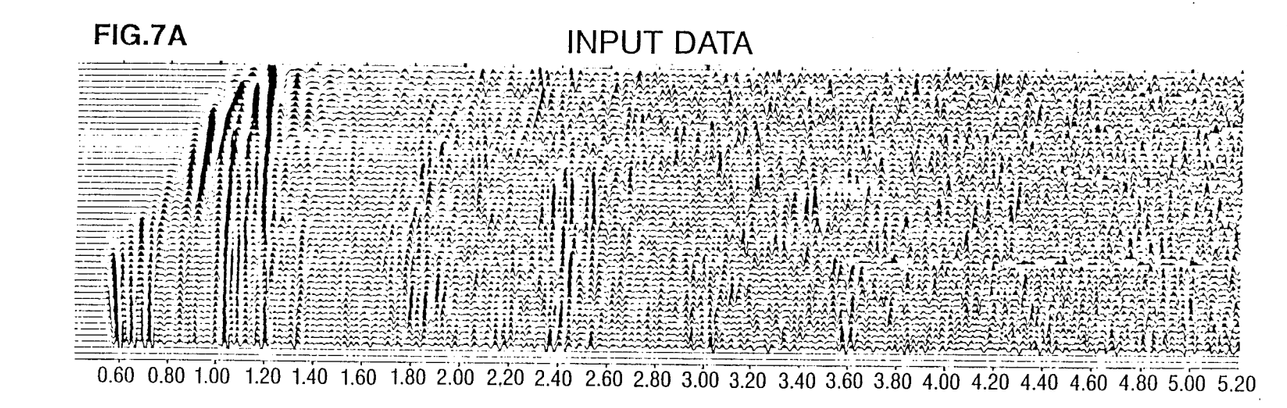
FIG. 7A illustrates input seismic data prior to processing with either the time-invariant or time-varying predictive deconvolution filters.
Figure 7B:
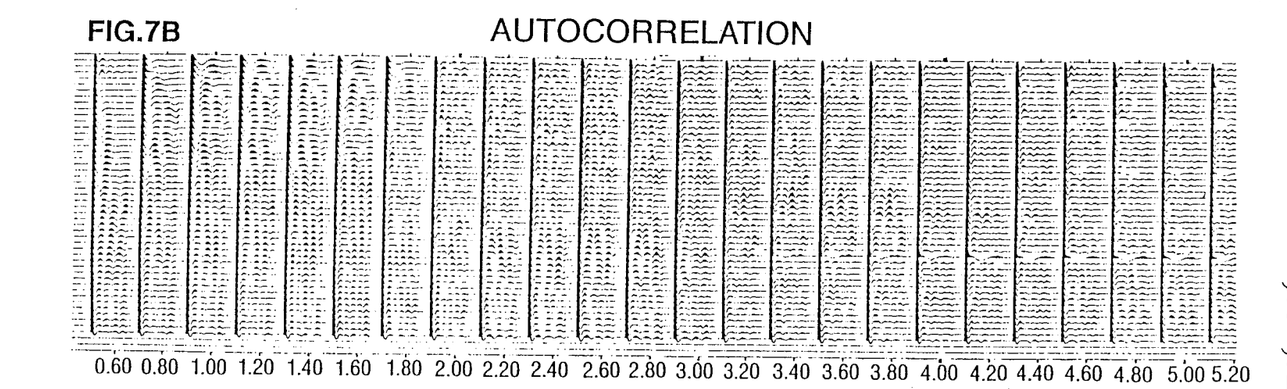
FIG. 7B represents the autocorrelation of the input data prior to filtering.
Figure 8A:
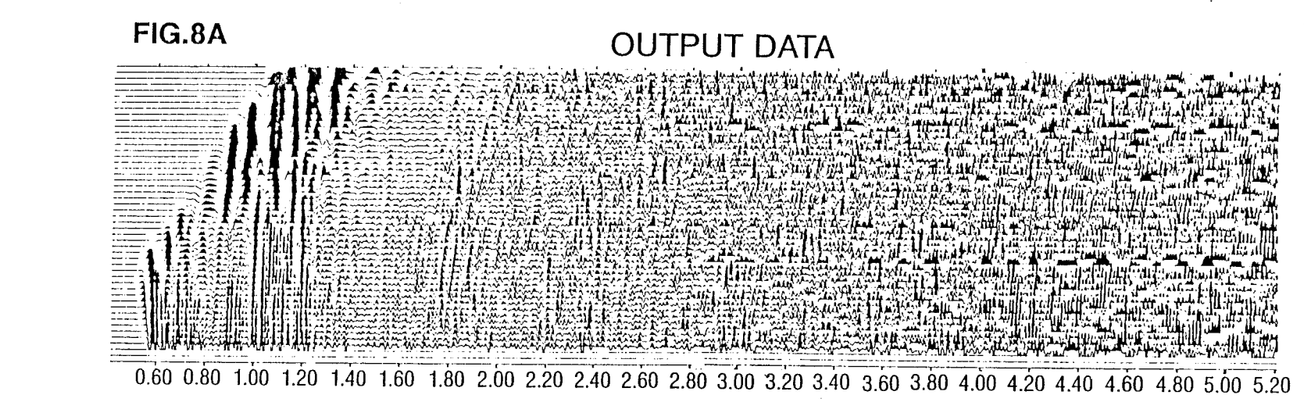
FIG. 8A represents the filtering of the input data of FIG. 7A with a time-invariant predictive deconvolution filter of the prior art.
Figure 8B:
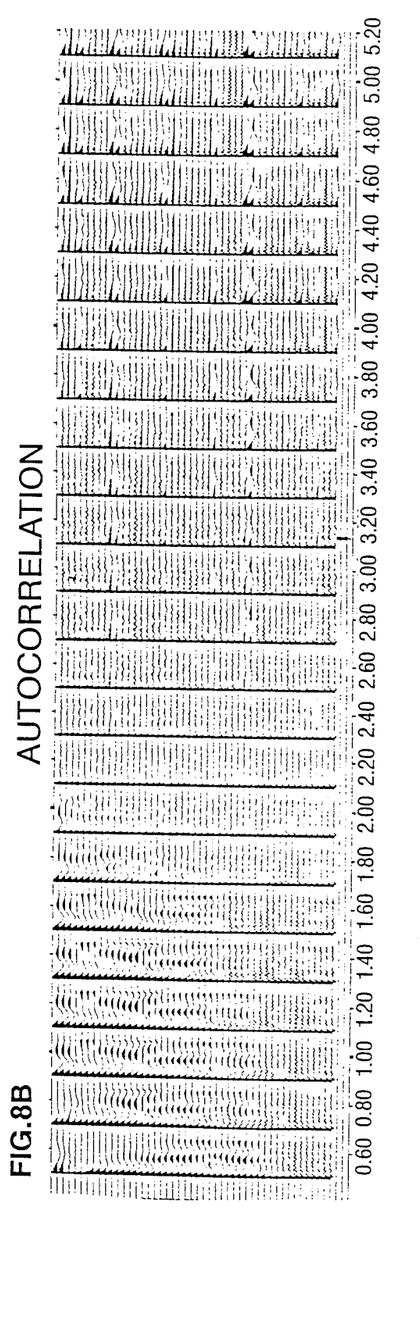
FIG. 8B represents the autocorrelation of the data in FIG. 7A.
Figure 9A:
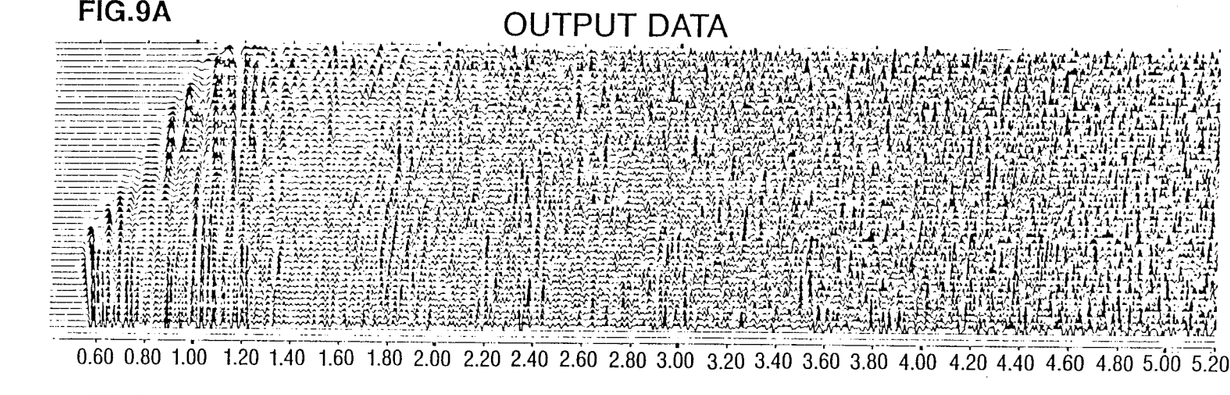
FIG. 9A illustrates the technique of the present invention applied to the input data of FIG. 7A.
Figure 9B:
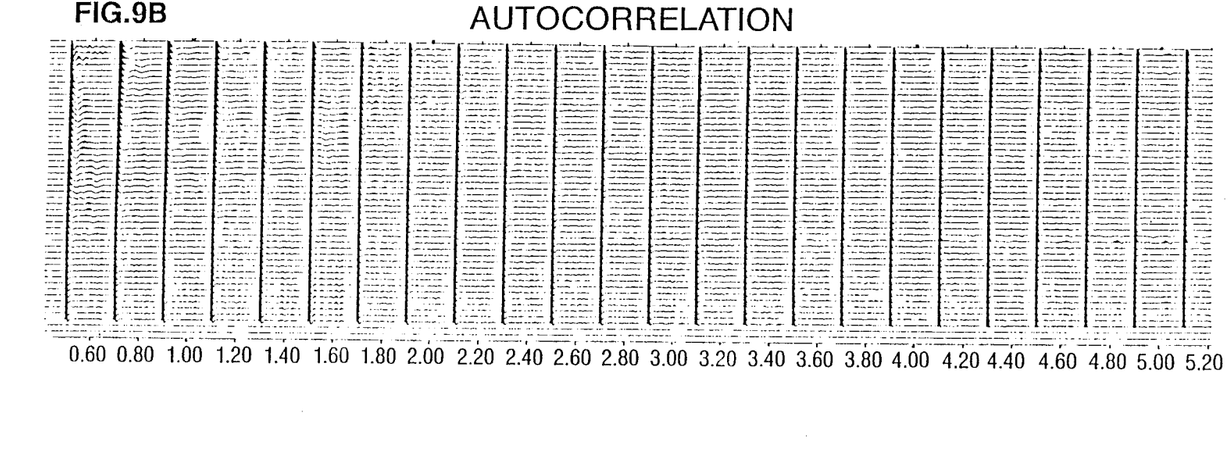
FIG. 9B illustrates the autocorrelation of the output data after processing in FIG. 7A.

FIG. 8A represents the results of processing the seismic data of FIG. 7A with a time-invariant filter and FIG. 8B represents an autocorrelation of filtered seismic data of FIG. 8A. This filter was designed on a time window of 1.6 to 2.6 sec. of the input data. This result is clearly shown in the autocorrelation of the input data in FIG. 8B. Now looking to FIG. 9A, the seismic data of FIG. 7A have been processed using the time-variant filter of the present invention. Additionally, FIG. 9B depicts an autocorrelation of the data in FIG. 9A. This time-variant filter of the present invention was designed over the entire length of the signal using time windows of 1.0 seconds advanced by 0.2 seconds for each subsequent filter computation. The autocorrelation of the filtered data shown in FIG. 9B is greatly improved over that shown in FIG. 8B.

It will be appreciated that there are numerous modifications and improvements which can be made to the method and apparatus of the invention and that, accordingly, the above description is to be considered merely exemplary of the invention and not as a limitation on its scope, which is defined by the following claims.

I claim:
1. A method for continuous time-variant filtering of digitized electric signals, comprising the steps of:
 (a) windowing an input digitized electric signal into discrete windows;
 (b) determining an autocorrelation matrix for each window of the input digitized electric signal;
 (c) determining a filter coefficient matrix for one sample point in each window of the input digitized electric signal from the corresponding autocorrelation matrix;
 (d) sequentially interpolating the filter coefficients from each window of the input digitized electric signal so as to obtain a filter coefficient for each sample point thereof;
 (e) forming a plurality of continuous filter operators from the corresponding filter coefficients from each window of the input digitized electric signal;
 (f) separately convolving each continuous filter operator with the input digitized electric signal to form a partial output signal; and
 (g) summing the partial output signals from the convolution of each continuous filter operator with the input digitized electric signal to form a filtered output electric signal.

2. The method of claim 1 further including windowing the input digitized electric signal into discrete but overlapping time windows.

3. The method of claim 2 wherein the step size of the overlapping consecutive time windows is between 0.1 to 0.5 seconds.

4. The method of claim 1 further including selecting a filter length, n, for the filter coefficient matrix.

5. The method of claim 4 wherein the length of the discrete time windows can be from $5 \times n$ to $10 \times n$.

6. The method of claim 4 further including selecting a prediction distance, $\alpha$, for the filter coefficient matrix.

7. The method of claim 4 further including controlling the resolution of the time variant filtering of the input digitized electric signal by selecting a prediction distance, $\alpha$, for the filter coefficient matrix.

8. A method for continuous time-variant filtering of digitized seismic signals, comprising the steps of:
 (a) windowing an input digitized seismic signal $x_t$ into discrete time windows $\Delta t_i$;
 (b) determining a filter operator $f_{i,n-1}$ for one sample point in each discrete time window, where n is a filter length;
 (c) interpolating corresponding filter operators $f_{i,n-1}$ to obtain filter operators $f_{i,n-1}$ for each sample point in the discrete time window $\Delta t_i$;
 (d) collecting corresponding elements of each of the filter operators $f_{i,n-1}$; to form a plurality of continuous filter operators $F_n$;
 (e) separately convolving each continuous filter operator $F_n$ with the input digitized seismic signal to form a partial output signal; and
 (f) summing the partial output signals to form a filtered output seismic signal.

9. The method of claim 8 further including the step of controlling the resolution of the time variant filtering by selecting prediction distances, $\alpha$, for the filter operator.

10. The method of claim 8 further including windowing the input digitized seismic signal into discrete but overlapping time windows.

11. A time-variant digital filter for continuous time-variant filtering of input digitized electric signals, comprising:
 (a) time gate means for gating the input digitized electric signal into discrete time windows;

(b) a filter generator, wherein the filter generator includes means for generating a set of continuous filter operators from corresponding elements of prediction error functions of each time window of the input digital electric signal, means for developing a plurality of continuous filter functions, and means for controlling the resolution of the digital filter; and (c) a continuous filter operator, wherein the continuous filter operator includes means for forming partially filtered signals by separately applying each continuous filter function to the input digitized electric signal, to form partially filtered signals and means for summing the partially filtered signals to form a finally filtered electric signal.

12. The time-variant digital filter of claim 11 further including means with the time gate for controlling the time window length and step size between consecutive time windows.

13. The time-variant digital filter of claim 11 further including means with the filter generator for controlling filter length and prediction distance of the continuous filter functions.

14. The time-variant digital filter of claim 11 wherein the filter generator further includes:

(a) a window generator including means for generating prediction error operators for each time window; and (b) an interpolator including means for interpolating corresponding elements of the prediction error operators for each input signal sample point and for curve fitting the interpolated corresponding elements of prediction error operator to form continuous filter functions.

15. A method for continuous time-variant filtering of digitized seismic signals comprising the steps of:

(a) windowIng an input digitized seismic signal into discrete time windows;

(b) determining a filter coefficient for one selected sample point within each time window of the input digitized seismic signal;

(c) interpolating the filter coefficient from adjacent discrete time windows of the input seismic signal for intermediate sample points to obtain a filter coefficient for each sample point and collecting corresponding filter coefficients to form a plurality of continuous filter operators;

(d) separately operating on the input digitized electric signal with each continuous filter operator to form a partial output signal; and (e) summing the partial output signals to form a filtered output electric signal.

16. The method of claim 15 wherein the filter coefficient has a length n, further including the step of:

controlling the resolution of the time variant filter by adjusting the filter coefficient length n.

17. The method of claim 16 further including the step of adjusting the discrete time window to be a multiple of at least five of the filter coefficient lengths.

* * * * *

UNITED STATES PATENT AND TRADEMARK OFFICE
CERTIFICATE OF CORRECTION

PATENT NO. : 4,837,723
DATED : Jun. 6, 1989
INVENTOR(S) : Kenneth L. Peacock

It is certified that error appears in the above—identified patent and that said Letters Patent is hereby corrected as shown below:

Column 7, line 29, "generated" should read --presented--.

Column 10, line 7, "windowIng" should read "windowing".

Signed and Sealed this

Fourth Day of September, 1990

Attest:

HARRY F. MANBECK, JR.

Attesting Officer

Commissioner of Patents and Trademarks